(12) United States Patent
Ando et al.

(10) Patent No.: US 9,958,306 B2
(45) Date of Patent: May 1, 2018

(54) THERMAL TYPE FLOW METER (71) Applicant: Hitachi Automotive Systems, Ltd., Hitachinaka-shi, Ibaraki (JP)

(72) Inventors: Ryo Ando, Hitachinaka (JP); Daisuke Terada, Hitachinaka (JP); Takeo Hosokawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 8 days.

(21) Appl. No.: 15/311,206

(22) PCT Filed: May 25, 2015

(86) PCT No.: PCT/JP2015/064844
§ 371 (c)(1),
(2) Date: Nov. 15, 2016

(87) PCT Pub. No.: WO2015/182531
PCT Pub. Date: Dec. 3, 2015

(65) Prior Publication Data
US 2017/0082472 A1   Mar. 23, 2017

(30) Foreign Application Priority Data

May 30, 2014 (JP) ................................. 2014-112979

(51) Int. Cl.
*G01F 1/698* (2006.01)
*H03K 17/16* (2006.01)
(Continued)

(52) U.S. Cl.
CPC ............ *G01F 1/698* (2013.01); *H03K 17/16* (2013.01); *H03K 17/162* (2013.01); *H03K 17/284* (2013.01); *H03K 19/0175* (2013.01)

(58) Field of Classification Search
CPC .... H03K 17/164; H03K 17/16; H03K 17/162; H03K 17/284; H03K 19/0175; G01F 1/698
See application file for complete search history.

(56) References Cited

U.S. PATENT DOCUMENTS

| 5,672,983 A | 9/1997 | Yamamoto et al. |
| 7,368,952 B2 * | 5/2008 | Ojiro ............... H03K 17/164 326/86 |

(Continued)

FOREIGN PATENT DOCUMENTS

| EP | 0 628 715 A2 | 12/1994 |
| EP | 2 063 531 A1 | 5/2009 |

(Continued)

OTHER PUBLICATIONS

International Search Report (PCT/ISA/210) issued in PCT Application No. PCT/JP2015/064844 dated Sep. 1, 2015 with English translation (5 pages).

(Continued)

*Primary Examiner* — Freddie Kirkland, III
(74) *Attorney, Agent, or Firm* — Crowell & Moring LLP (57) ABSTRACT A thermal-type flow meter for representing a flow rate of air by the frequency of a periodic signal, wherein abnormalities in the waveform of an output signal due to frequency variation is prevented while high-frequency noise is suppressed. The thermal-type flow meter pertaining to the present invention is provided with a plurality of switching elements connected in parallel, and varies a delay width between the switching elements in accordance with variation of the frequency of a periodic signal for representing a flow rate.

10 Claims, 10 Drawing Sheets (51) Int. Cl.
*H03K 19/0175* (2006.01)
*H03K 17/284* (2006.01)

(56) References Cited

U.S. PATENT DOCUMENTS

| | | | | |
|---|---|---|---|---|
| 7,675,351 | B2 * | 3/2010 | Ando | ............... G01F 15/00 327/538 |
| 2005/0237085 | A1 | 10/2005 | Ojiro | |
| 2005/0237095 | A1 | 10/2005 | Ando | |

FOREIGN PATENT DOCUMENTS

| | | |
|---|---|---|
| JP | 64-35218 A | 2/1989 |
| JP | 1-228214 A | 9/1989 |
| JP | 8-228141 A | 9/1996 |
| JP | 11-239046 A | 8/1999 |
| JP | 2001-285051 A | 10/2001 |
| JP | 2005-311664 A | 11/2005 |
| JP | 2005-333618 A | 12/2005 |
| JP | 2010-10767 A | 1/2010 |

OTHER PUBLICATIONS

Japanese-language Written Opinion (PCT/ISA/237) issued in PCT Application No. PCT/JP2015/064844 dated Sep. 1, 2015 (3 pages).
Extended European Search Report issued in European Patent Application No. 15798963.3 dated Jan. 12, 2018 (Eight (8) pages).

* cited by examiner

THERMAL TYPE FLOW METER

TECHNICAL FIELD

The present invention relates to a thermal-type flow meter.

BACKGROUND ART

A thermal-type flow meter is a sensor to measure a flow rate of flown air on the basis of a current necessary for returning a temperature of a heating wire which is changed by the ambient flowing air. The measured flow rate can be represented by aperiodic signal having a frequency corresponding to the flow rate for example. The periodic signal is input to an open drain circuit (or an open collector circuit; the same shall apply hereinafter) for example, and a frequency of a signal output from the open drain circuit is detected by a frequency measurement circuit, so that the flow rate can be detected.

The open drain circuit turns on/off a switching element to output an output signal of a high/low level. The output signal corresponding to the flow rate represented by the frequency of the periodic signal can be output by turning on/off the switching element according to the frequency of the periodic signal.

The output signal becomes a rectangular wave due to the configuration of the open drain circuit. Therefore, high-frequency noises are generated. As a means for relieving the high-frequency noises, it is considered that a plurality of switching elements are connected in parallel at multiple stages, and shifts timing for switching the switching elements so as to output the step-shape output signal. PTL 1 describes a specific example of the open drain circuit in which the switching timings of the respective switching elements are different.

CITATION LIST

Patent Literature

PTL 1: JP 01-228214 A

SUMMARY OF INVENTION

Technical Problem

A frequency of a periodic signal input to an open drain circuit changes according to a measured flow rate. Therefore, the ON/OFF period of the switching element of the open drain circuit is shortened when the frequency of the periodic signal is increased.

In the technology disclosed in PTL 1, a delay time interval between the switching elements is constant. Therefore, when the frequency of the periodic signal is increased to some degree or more, the switching element at the first stage makes an operation of the next period before the switching element at the final stage operates. Therefore, there is a possibility that the output signal may be not changed from the high level to the low level in one period. In this case, it is difficult to detect a flow rate represented by the frequency of the periodic signal with accuracy.

The invention has been made in view of the problems described above, and an object thereof is to provide a thermal-type flow meter which measures a flow rate of air using the frequency of the periodic signal, in which a waveform abnormality of the output signal caused by a frequency change can be avoided while suppressing high-frequency noises.

Solution to Problem

A thermal-type flow meter according to the invention includes a plurality of switching elements connected in parallel, and changes a delay duration between the switching elements according to a frequency change of the periodic signal representing a flow rate.

Advantageous Effects of Invention

According to a thermal-type flow meter of the invention, it is possible to suppress that a peak value and a frequency of an output signal become abnormal values even when the frequency of the periodic signal changes while suppressing high-frequency noises caused from a plurality of switching elements connected in parallel.

DESCRIPTION OF EMBODIMENTS

Problems of Related Art

In the following, problems in the related art will be first described in detail in order to help with understanding on the present invention, and then embodiments of the invention will be described.

Countermeasures for radiation electromagnetic waves generated when an output signal indicating information using a frequency is output from an open collector circuit are as follows.

Figure 1:
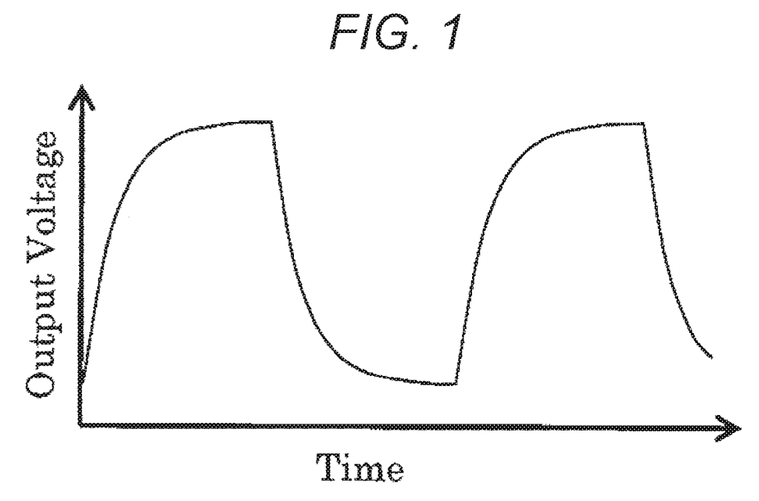
FIG. 1 is a diagram illustrating an exemplary waveform of an output signal in a case where an electromagnetic wave noise is suppressed using a low-pass filter.

FIG. 1 is an exemplary waveform of the output signal in a case where an electromagnetic wave noise is suppressed using a low-pass filter, The low-pass filter configured by a combination of an inductor, a capacitor, and a resistor is disposed in an output terminal of an open drain circuit. In this case, as illustrated in FIG. 1, a voltage is steeply changed at the beginning when the output signal falls down and rises up, and a high-frequency component is contained in the output signal. The waveform when the voltage V falls down is expressed by the following Equation 1, and the waveform when the voltage V rises up is expressed by the following Equation 2. Herein, A is a peak value, β is a time constant, α is a constant, and t is time, When the voltage starts to rise up or fall down, is set to 0.

$$V = A * \text{Exp}(-\beta * t) + \alpha \qquad \text{Equation 1}$$

$$V = A * (1 - \text{Exp}(-\beta * t)) + \alpha \qquad \text{Equation 2}$$

Figure 2:
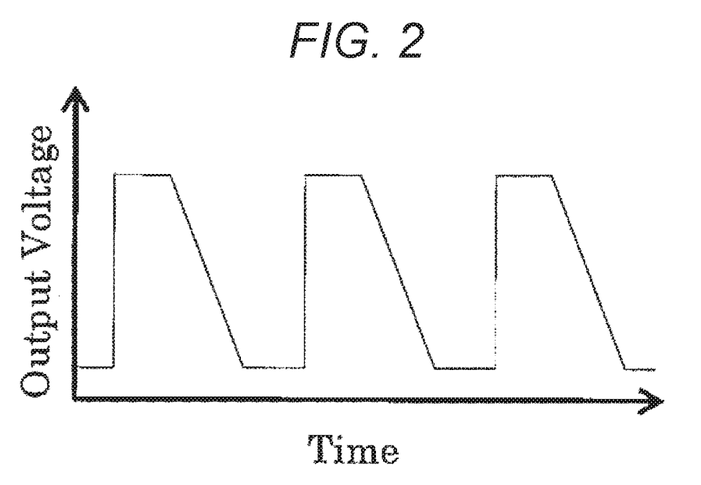
FIG. 2 is a diagram illustrating an exemplary waveform of an output signal in a case where a current flowing to an open drain circuit is limited using a current mirror circuit.

FIG. 2 is a diagram illustrating an exemplary waveform of the output signal in a case where a current flowing to the open drain circuit is limited using a current mirror circuit. In this case, the current is not limited when the voltage falls down as illustrated in FIG. 2.

An ideal waveform as a periodic signal is a sinusoidal waveform. However, in a case where the frequency is output using the open drain circuit, a transistor of the output stage is turned ON/OFF, and the voltage of the output signal is received from an external voltage source. Therefore, a signal waveform output by the open drain circuit becomes a rectangular waveform as a principle. When a rectangular wave function X of a frequency f is subjected to Fourier expansion, the following Equation 3 is obtained. Herein, ω is set to 2πf. in other words, the rectangular wave is evaluated as a signal in which a sinusoidal wave having a frequency higher than necessary is mixed.

[Expression 1]

$$X = \frac{1}{2} + \frac{1}{\pi}\sum_{1}^{\infty}\left\{\frac{1}{n}(1 - \cos(n\pi) \cdot \sin(n\omega t))\right\} \qquad \text{Equation 3}$$

When the voltage is a rectangular wave, the current is also a rectangular wave. Therefore, Equation 3 represents a waveform of the current flowing into the output terminal of the open drain circuit. When the current I flows, a magnetic field H is generated around the current I as expressed in Equation 4. Herein, r represents a distance from the current.

$$H = I/(2 * \pi * r) \qquad \text{Equation 4}$$

A relation between the magnetic field H and the electric field E is expressed by the following Equation 5 using Maxwell's equations. As a temporal variation of the magnetic field H becomes large, a stronger electric field E is generated. Herein, μ is magnetic permeability, and t is time. Therefore, when a rectangular current flows, a high-frequency electromagnetic wave is radiated even though the frequency is low, which affects a noise influence on the surrounding machines.

[Expression 2]

$$\nabla \times E = -\mu * \left(\frac{dH}{dt}\right) \qquad \text{Equation 5}$$

It can be seen that a small temporal variation of the current flowing to the output terminal of the open drain circuit is an effective countermeasure against the high-frequency noise from Equations 4 and 5. As a method of realizing the countermeasure, there is considered a method in which a plurality of open drain transistors are connected to the output terminal in parallel, a time difference is put at a switching timing of conducting the transistor, and the current flowing to the output terminal is switched in plural times.

However, in a case where a sensor outputs a physical quantity according to a frequency of the periodic signal, an output frequency is not constant but temporally varies. Therefore, when the output frequency becomes high, the output waveform becomes abnormal. Such an abnormal waveform will be described below.

Figure 3:
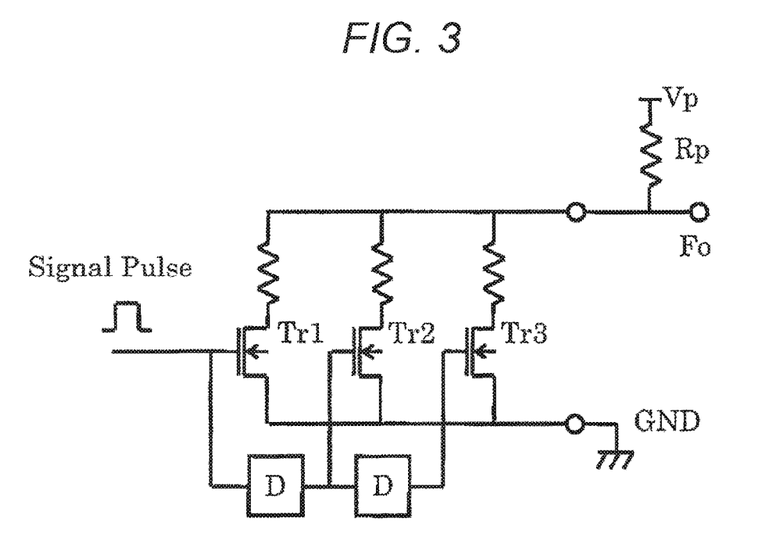
FIG. 3 is a circuit diagram illustrating an example of the open drain circuit in which switching is delayed using a delay circuit.

FIG. 3 is a circuit diagram illustrating an example of the open drain circuit in which the time difference is put at the switching timing using a delay circuit as disclosed in PTL 1. In FIG. 3, three open drain transistors, each of which has a drain terminal connected with a current limit resistor, are connected to the output terminal in parallel. Delay circuits D having a delay time τ are disposed between the gates of three open drain transistors Tr1, Tr2, and Tr3, The source terminals of the open drain transistors Tr1 to Tr3 are earthed to the ground. The drain terminals of the open drain transistors Tr1 to Tr3 are connected to an output terminal Fo. A pull-up resistor Rp is connected to the drain terminal, the output signal is pulled up by a voltage Vp.

The open drain transistors Tr1 to Tr3 are controlled by inputting the periodic signal (signal pulse) to the gate terminal. When the signal pulse to make the open drain transistors Tr1 to Tr3 conductive is input, the transistor Tri first comes to be conductive, the transistor Tr2 conies to be conductive at a timing delay by τ, and then the transistor Tr3 comes to be conductive at a timing further delayed by τ. When the signal pulse to make the open drain transistors Tr1 to Tr3 not conductive is input, the transistor Tr1 first conies to be non-conductive, the transistor Tr2 comes to be non-conductive at a timing delayed by τ and then the transistor Tr3 comes to be non-conductive at a timing further delayed by τ.

Figure 4:
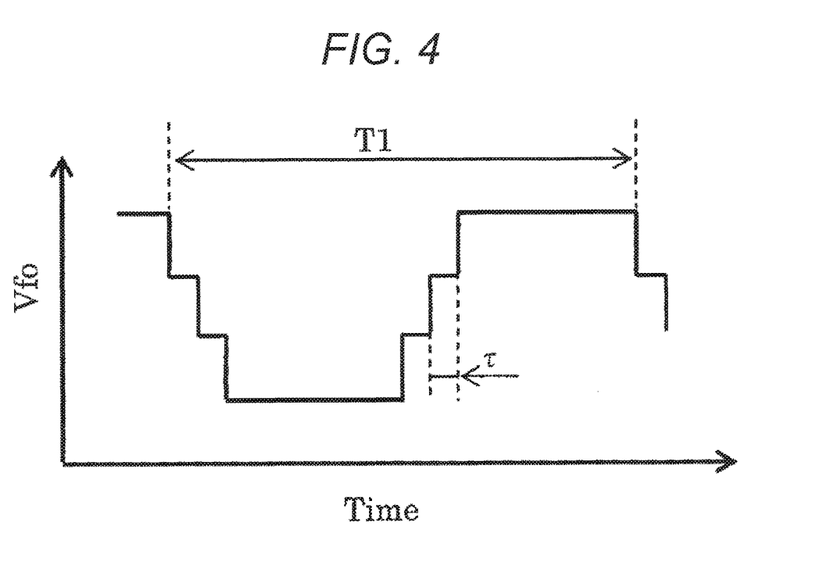
FIG. 4 is a waveform diagram of the output signal in a case where a signal pulse of a period T1 is input to the open drain circuit of FIG. 3.

FIG. 4 is a waveform diagram of the output signal in a case where the signal pulse having a period T1 is input to the open drain circuit of FIG. 3, When the open drain transistors Tr1 to Tr3 sequentially come to be conductive to cause the current to flow, an output voltage Vfo falls down. When the open drain transistors sequentially come to be non-conductive, the output voltage Vfo rises up. A period of the output signal is the same period T1 as that of the signal pulse.

Figure 5:
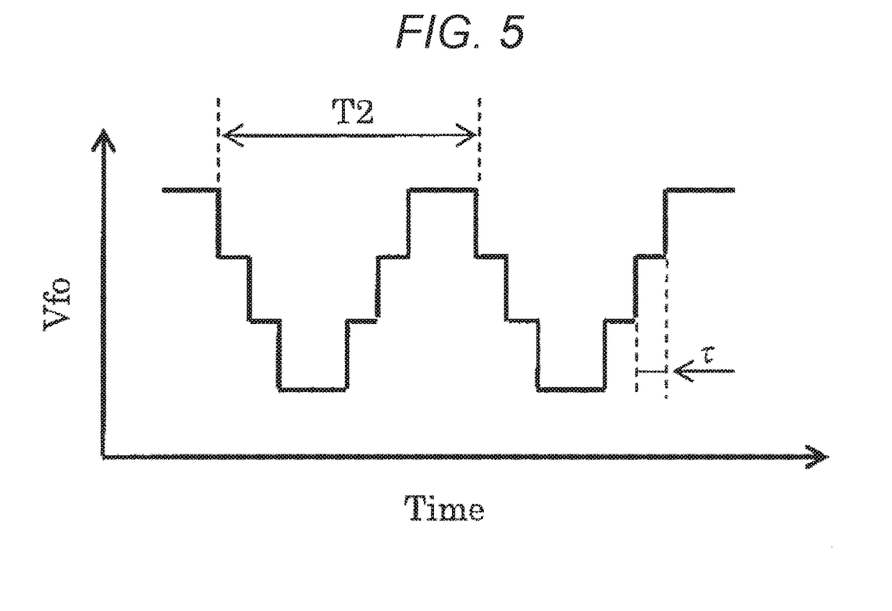
FIG. 5 is a waveform diagram of the output signal in a case where the signal pulse of a period T2 shorter than T1 is input to the open drain circuit of FIG. 3.

FIG. 5 is a waveform diagram of the output signal in a case where the signal pulse having a period τ2 shorter than TI is input to the open drain circuit of FIG. 3. Comparing to FIG. 4, the switching time interval is the same between the conduction and the non-conduction of each transistor since there is no change in the delay time τ. However, the waveform period becomes shorter than that in FIG. 4.

Figure 6:
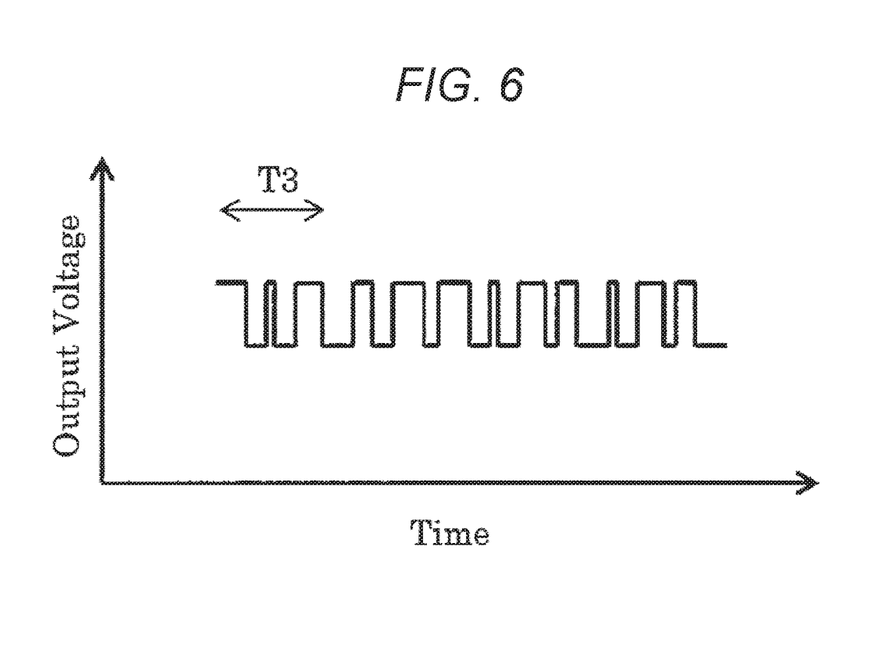
FIG. 6 is a waveform diagram of the output signal in a case where the signal pulse of a period T3 (<4 τ) is input to the open drain circuit of FIG. 3.

FIG. 6 is a waveform diagram of the output signal in a case where the signal pulse having a period T3 (<4τ) is input to the open drain circuit of FIG. 3. In FIG. 6, the transistor Tr1 performs the next switching operation before the transistor Tr3 operates at 2τ after the transistor Tr1 is switched. Therefore, since the open drain transistors Tr1 to Tr3 all are not in the same operation state (conduction or non-conduction), the signal waveform is not possible to reach an upper limit (Hi level) and a lower limit (Low level). In other words, the peak value of the output signal becomes small, and the period becomes shorter than T3 and does not become constant.

The invention relates to an open drain circuit in which a plurality of switching elements are connected to the output terminal in parallel to provide a time difference in operation timing of the respective switching elements so as to suppress a steep change in the waveform, and an object thereof is to avoid an abnormal waveform of the output signal as illustrated in FIG. 6.

First Embodiment

Figure 7:
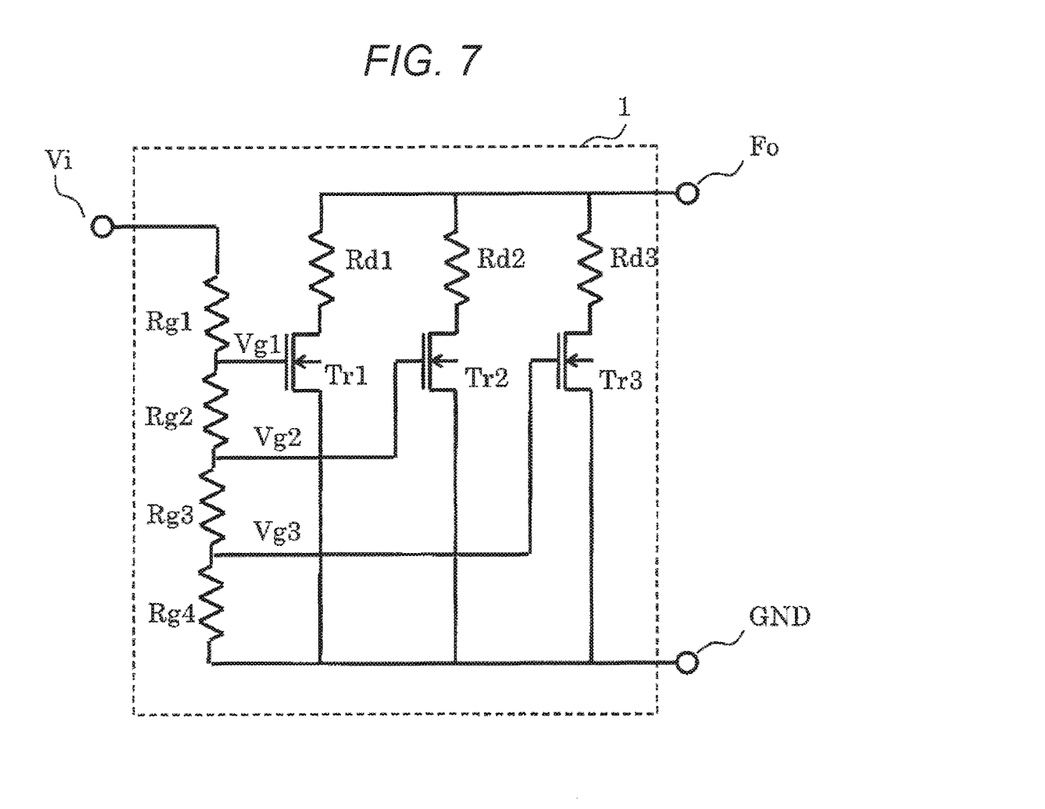
FIG. 7 is a circuit diagram of an open drain circuit 1 according to a first

FIG. 7 is a circuit diagram of an open drain circuit 1 according to a first embodiment of the invention. In FIG. 7, three open drain transistors Tr1 to Tr3 each are connected to the output terminal Fo through current limit resistors Rd1 to Rd3. In an input terminal Vi, an input signal Vi is input to drive the transistors Tr1 to Tr3.

Voltages Vg1 to Vg3 obtained by dividing the input signal Vi using voltage-dividing resistors Rg1 to Rg4 are input to the gate terminals of the transistors Tr1 to Tr3, respectively. Relations between Vi and Vg1 to Vg3 are represented by the following Equations 6 to 8.

$$Vg1=Vi*(Rg2+Rg3+Rg4)/(Rg1+Rg2+Rg3+Rg4) \quad \text{Equation 6}$$

$$Vg2=Vi*(Rg3+Rg4)/(Rg1+Rg2+Rg3+Rg4) \quad \text{Equation 7}$$

$$Vg3=Vi*Rg4/(Rg1+Rg2+Rg3+Rg4) \quad \text{Equation 8}$$

Assuming that a gate-source voltage (threshold voltage Vth) where the drain-source of the transistor becomes conductive/non-conductive is the same in the respective transistors Tr1 to Tr3, Vi when the gate-source voltage of each transistor becomes Vth is expressed by the following Equations 9 to 11 sequentially from Tr1. According to these equations, it can be seen that the values of Vi to switch the conduction/non-conduction of the respective transistors become different from each other.

$$Vi=Vth*(Rg1+Rg2+Rg3+Rg4)/(Rg2+Rg3+Rg4) \quad \text{Equation 9}$$

$$Vi=Vth*(Rg1+Rg2+Rg3+Rg4)/(Rg3+Rg4) \quad \text{Equation 10}$$

$$Vi=Vth*(Rg1+Rg2+Rg3+Rg4)/Rg4 \quad \text{Equation 11}$$

Figure 8:
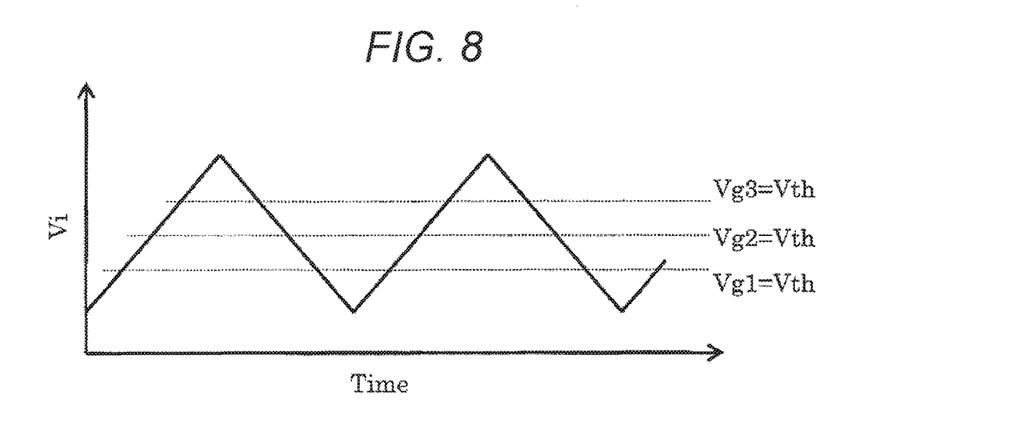
FIG. 8 is a waveform diagram of an input signal Vi.

FIG. 8 is a waveform diagram of the input signal Vi. Herein, a triangular wave is used for example. As illustrated in FIG. 8, the transistors Tr1 to Tr3 reach the threshold voltage Vth at different voltage values of the triangular wave. Therefore, the respective transistors are switched at timings different from each other.

Figure 9:
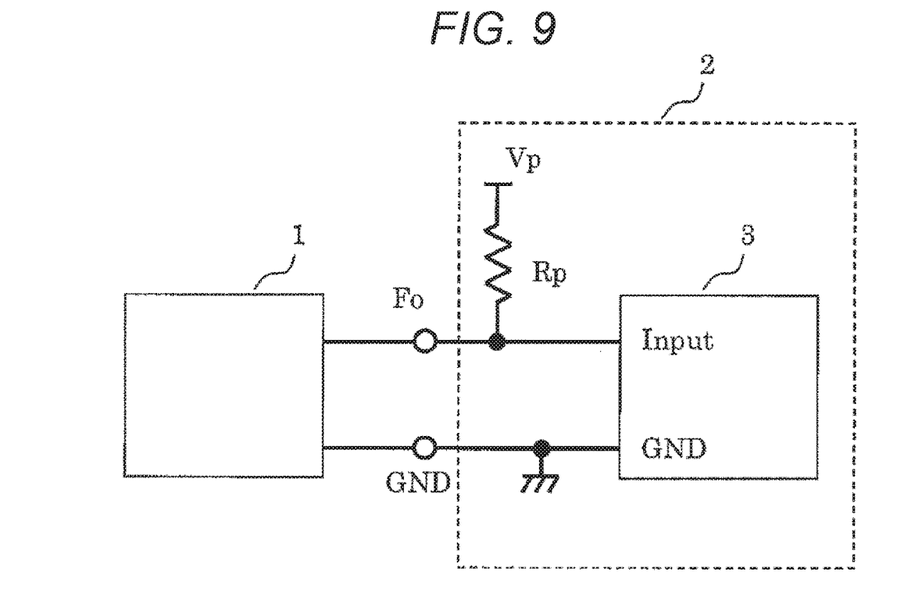
FIG. 9 is a diagram illustrating an exemplary configuration of a frequency measurement circuit 2 which is connected to the open drain circuit 1.

FIG. 9 is a diagram illustrating an exemplary configuration of a frequency measurement circuit 2 which is connected to the open drain circuit 1. The frequency measurement circuit 2 is provided with a frequency meter 3, a pull-up power source Vp, and the pull-up resistor Rp. An input terminal Input of the frequency meter 3 is connected to the output terminal Fo of the open drain circuit 1, and further connected to the pull-up power source Vp through the pull-up resistor Rp.

Figure 10:
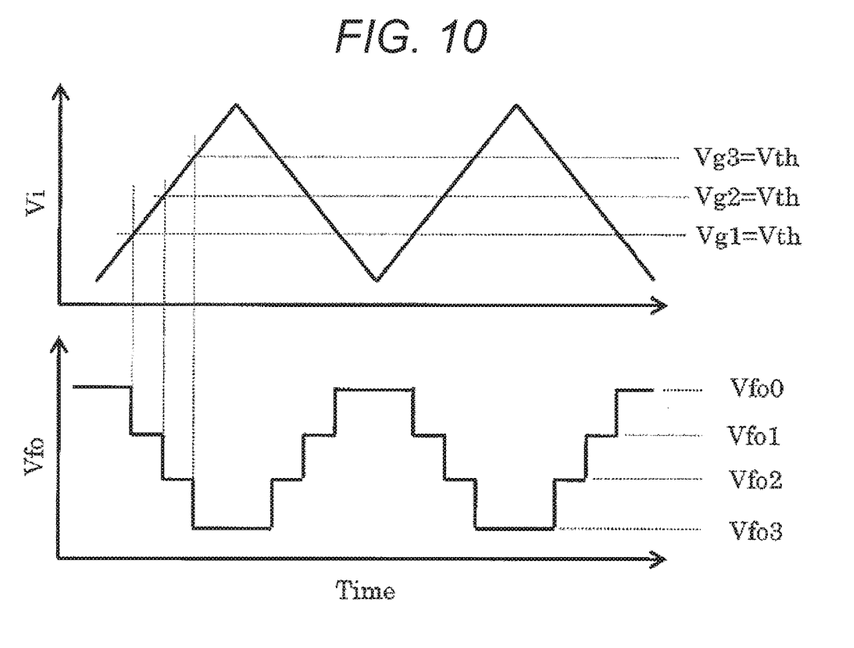
FIG. 10 is a waveform diagram of an output voltage Vfo when the input signal Vi of a triangular wave is input to the open drain circuit 1 in a circuit configuration of FIG. 9.

FIG. 10 is a waveform diagram of the output voltage Vfo when the input signal Vi of the triangular wave is input to the open drain circuit 1 in the circuit configuration of FIG. 9. The respective transistors are switched when the input signal Vi becomes the values represented by Equations 9 to 11. Therefore, the output voltage Vfo changes in a stepwise shape as illustrated in FIG. 10.

The output voltage Vfo when the transistors Tr1 to Tr3 are in a non-conductive state is set to Vfo0, the output voltage Vfo when the transistor Tr1 is in the conductive state and the transistors Tr2 and Tr3 are in the non-conductive state is set to Vfo1, the output voltage Vfo when the transistors Tr1 and Tr2 are in the conductive state and the transistor Tr3 is in the non-conductive state is set to Vfo2, and the output voltage Vfo when the transistors Tr1 to Tr3 are in the conductive state is set to Vfo3. These output voltages are expressed by the following Equations 12 to 15, respectively.

$$Vfo0=Vp \quad \text{Equation 12}$$

$$Vfo1=Vp*Rd1/(Rd1+Rp) \quad \text{Equation 13}$$

$$Vfo2=Vp*Rd12/(Rd12+Rp) \quad \text{Equation 14}$$

$$Vfo3=Vp*Rd123/(Rd123+Rp) \quad \text{Equation 15}$$

In Equation 14, Rd12 is a combined resistor obtained by connecting the resistors Rd1 and Rd2 in parallel, and expressed by the following Equation 16. In Equation 15, Rd123 is a combined resistor obtained by connecting the resistors Rd1 to Rd3 in parallel, and expressed by the following Equation 17.

$$Rd12=Rd1*Rd2/(Rd1+Rd2) \quad \text{Equation 16}$$

$$Rd123=Rd1*Rd2*Rd3/(Rd1*Rd2+Rd2*Rd3+Rd3*Rd1) \quad \text{Equation 17}$$

According to Equations 13 to 15, it can be seen that Vfo1=Vfo2=Vfo3=0 when there is no current limit resistors Rd1 to Rd3 in FIG. 1, and the output waveform does not change in a stepwise shape so as to obtain a rectangular waveform in which a high-potential side becomes Vp and a low-potential side becomes 0 (V).

Figure 11:
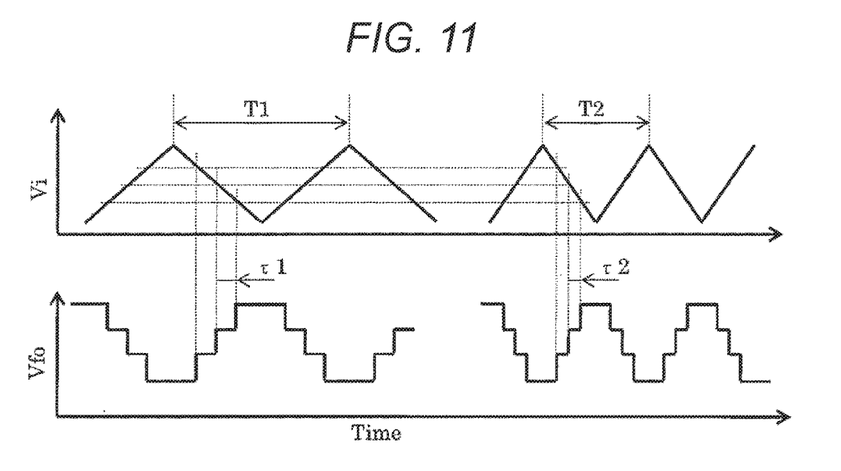
FIG. 11 is a diagram illustrating a waveform of the output voltage Vfo in a case where a period of the input signal Vi is changed in the circuit configuration of FIG. 9.

FIG. 11 illustrates a waveform of the output voltage Vfo in a case where a period of the input signal Vi changes in the circuit configuration of FIG. 9. The time difference between the switching timings of the respective transistors when the period of Vi is T1 is and the time difference between the switching timings when the period of Vi is τ2 is τ2. As described in FIG. 10, the switching timings of Tr1 to Tr3 depend on the potential of Vi. Therefore, when the period of Vi (the triangular wave) changes, the time difference between the switching timings of the respective transistors is in proportion to the period. The relation between T1, τ2, τ1, and τ2 in FIG. 11 is expressed by the following Equation 18.

$$T1/T2=\tau 1/\tau 2 \qquad \text{Equation 18}$$

First Embodiment: Summary

As described above, the open drain circuit 1 according to the first embodiment is provided with the delay circuit (the voltage-dividing circuit in the first embodiment) which deviates the switching timings for each of the respective transistors Tr1 to Tr3. The delay circuit causes the delay time interval t between the respective transistors to be changed according to the frequency of the input signal Vi with respect to the open drain circuit 1. Therefore, the delay time interval 7 is also shortened when the period of the input signal Vi is shortened, so that it is possible to suppress an abnormality in waveform of the output signal as illustrated in FIG. 6. In other words, the information is represented by the frequency of the input signal Vi, and the frequency measurement circuit 2 measures the frequency. Therefore, in a case where the information is acquired, it is possible to suppress an abnormality in measurement as illustrated in FIG. 6.

Second Embodiment

As shown in Equations 13 to 15 described in the first embodiment, the voltages Vfo1 to Vfo3 when the output voltage Vfo is switched in a stepwise shape are obtained by divided by the pull-up power source Vp using the pull-up resistor Rp and the current limit resistors Rd1 to Rd3. The pull-up resistor Rp and the current limit resistors Rd1 to Rd3 may be manufactured by a semiconductor process in many cases. A resistor manufactured by the semiconductor process may have a deviation in resistance (for example, about=±20%). In addition, there is also deviation in temperature property of the resistance. The open drain circuit 1 and the frequency measurement circuit 2 are manufactured separately Therefore, the pull-up resistor Rp and the current limit resistors Rd1 to Rd3 have a large deviation in a ratio of resistance value and in a ratio of temperature property of the resistance. If there occurs such a deviation in resistance value, the following problems are caused in real products.

In the frequency meter 3 of FIG. 9, the voltage Vc is set for comparison with the output voltage Vfo. The comparison voltage Vc is set to a voltage between 0 (V) and the pull-up voltage Vp. The frequency meter 3 measures a frequency and a period of an output signal Vfo by measuring a time when a magnitude relation between Vfo and Vc is changed.

Figure 12:
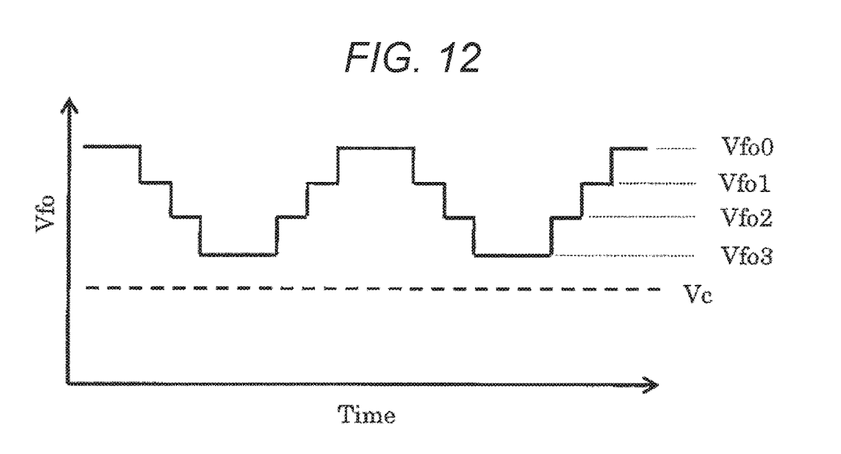
FIG. 12 is a diagram illustrating an exemplary waveform in which an output signal Vfo does not intersect with a comparison voltage Vc.

FIG. 12 is an exemplary waveform in which the output signal Vfo and the comparison voltage Vc do not intersect. In this case, the output voltage Vfo is always larger than the comparison voltage Vc. Therefore, the frequency meter 3 is not possible to measure the frequency of the output signal Vfo. As can be seen from Equations 13 to 15, when the resistance values of the current limit resistors Rd1 to Rd3 are increasingly deviated with respect to the resistance value of the pull-up resistor Rp, Vfo1 to Vfo3 are also increased, which causes a situation as illustrated in FIG. 12. In a second embodiment of the invention, an exemplary circuit coping with such a problem will be described.

Figure 13:
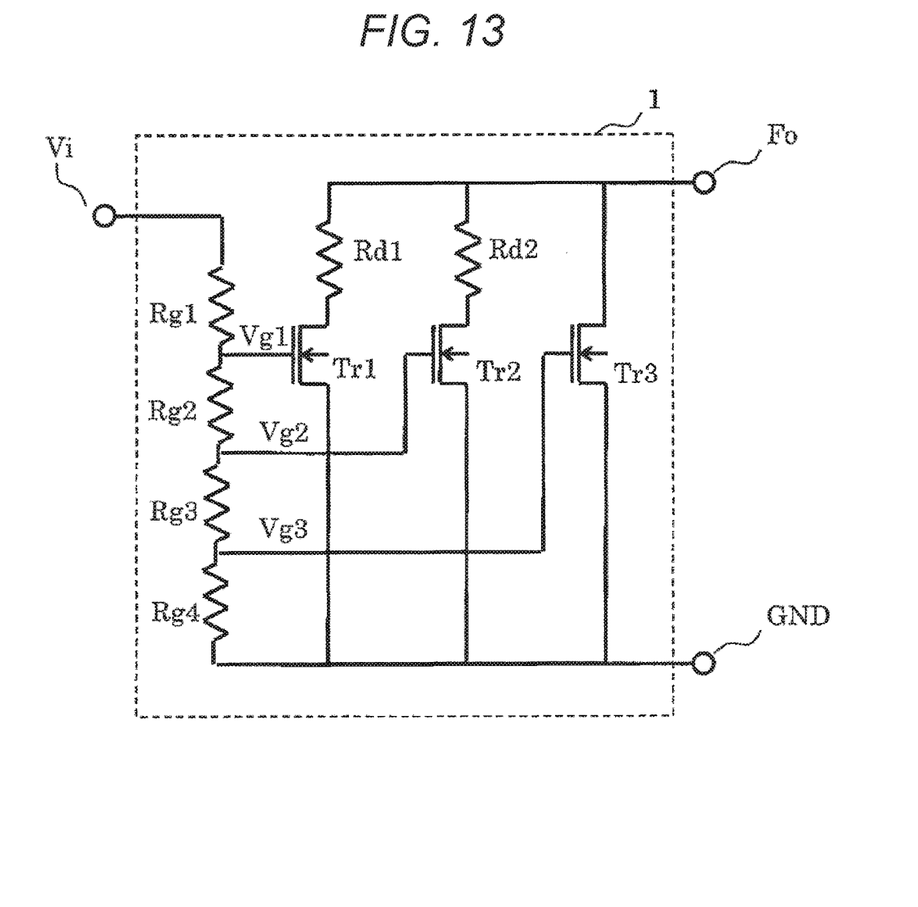
FIG. 13 is a circuit diagram of the open drain circuit 1 according to a second embodiment.

FIG. 13 is a circuit diagram of the open drain circuit 1 according to the second embodiment. The open drain circuit 1 of FIG. 13 is configured such that the current limit resistor Rd3 is not provided in the circuit configuration illustrated in FIG. 7 and the drain terminal and the output terminal Fo of the transistor Tr3 are short-circuited. In the circuit configuration of FIG. 13, the output voltage Vfo becomes 0 (V) when Tr3 comes to a conductive state. Therefore. Vfo can become a potential lower than that of ye regardless of the deviation in resistance of the pull-up resistor Rp and the current limit resistors Rd1 to Rd3.

Figure 14:
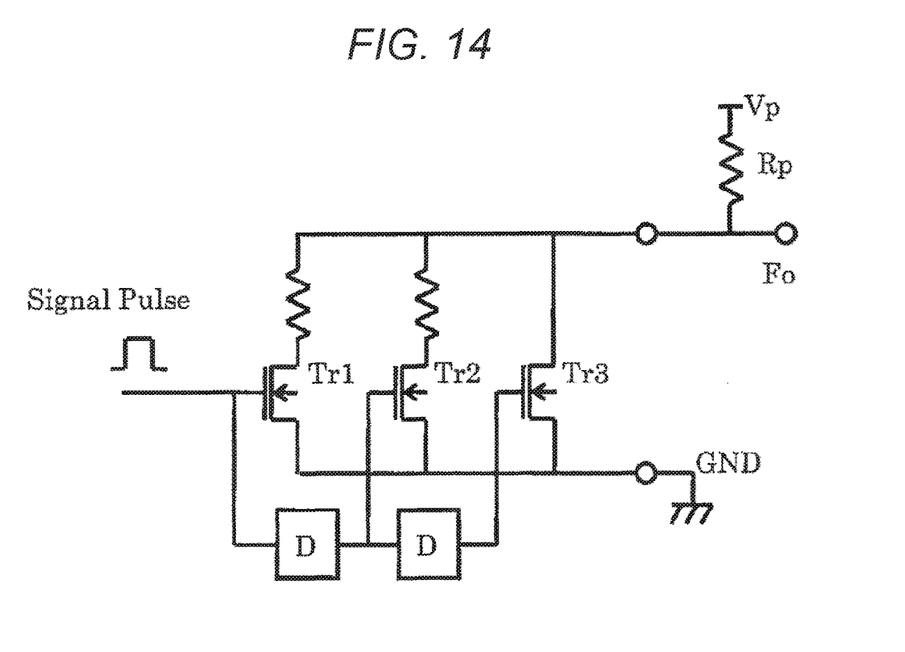
FIG. 14 is a diagram illustrating a circuit configuration from which a current limit resistor connected to a drain terminal of a transistor Tr3 is removed to be short-circuited to an output terminal Fo in the conventional open drain circuit illustrated in FIG. 3.

FIG. 14 illustrates a circuit configuration from which the current limit resistor connected to the drain terminal of the transistor Tr3 is removed from the conventional open drain circuit illustrated in FIG. 3, and thus the drain terminal is short-circuited with the output terminal Fo. In the conventional circuit configuration, a defect described below will be caused when the drain terminal of the transistor Tr3 is short-circuited with the output terminal Fo similarly to the second embodiment.

In the circuit configuration of FIG. 14, an order of switching the transistors Tr1 to Tr3 from the non-conduction to the conduction is equal to the order from the conduction to the non-conduction. In other words, Tr1 is first switched and Tr3 is finally switched in either case.

In a case where the open drain transistors Tr1 to Tr3 are switched from the non-conduction to the conduction, the output voltage Vfo is switched in a stepwise shape. On the contrary, in a case where the transistors are switched from the conduction to the non-conduction, Vfo remains at 0 (V) during a period when Tr3 is in conduction even Tr1 and Tr2 are in non-conduction. Thereafter, Vfo becomes the same potential as that of the pull-up voltage Vp when Tr3 is switched to the non-conduction. Tr3 comes to the conductive state to cause the output terminal Fo to be short-circuited to GND.

Figure 15:
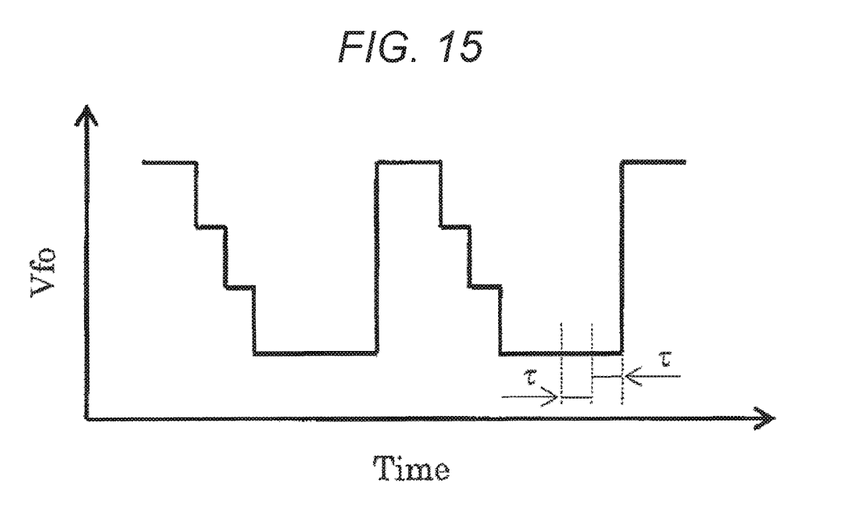
FIG. 15 is a diagram illustrating a waveform of the output signal of the open drain circuit of FIG. 14.

FIG. 15 is a diagram illustrating a waveform of the output signal of the open drain circuit of FIG. 14. In FIG. 15, the waveform is switched at one time without changing in a stepwise shape when the output waveform is switched from a low potential (low level) to a high potential (high level). When the output waveform is steeply switched in this way, the effect of reducing radiation noises may be lessened.

In order to relieve such a steep change in output waveform illustrated in FIG. 15, Tr3 having no current limit resistor is finally switched in a case where the open drain transistors Tr1 to Tr3 are switched from the non-conduction to the conduction, and Tr3 having no current limit resistor is firstly switched in the case of the order of switching from the conduction to the non-conduction is switched. In the first and second embodiments using the frequency signal of the triangular wave as the input signal Vi, the order of switching the open drain transistors Tr1 to Tr3 from the non-conduction to the conduction is in reverse to the order from the conduction to the non-conduction. In other words, Tr3 is finally switched in the case of switching from the non-conduction to the conduction, and Tr3 is firstly switched in the case of switching from the conduction to the non-conduction. Therefore, in the open drain circuit 1 according to the first and second embodiments, it is possible to suppress the steep change in output waveform illustrated in FIG. 15.

Second Embodiment: Summary

As described above, the open drain circuit 1 according to the second embodiment can suppress the problem as illustrated in FIG. 12 in that the resistance values of the pull-up resistor Rp and the current limit resistors Rd1 to Rd3 are deviated. Furthermore, it is possible to suppress a steep change in output waveform as illustrated in FIG. 15 in a case where the similar configuration is employed to the conventional open drain circuit.

In the second embodiment, the drain terminal of Tr3 has been short-circuited with the output terminal Fo, and the other transistors may be short-circuited in the same way. For example, the drain terminal of Tr2 may be short-circuited with the output terminal Fo. However, it is desirable that the transistor at the final stage be short-circuited with the output terminal Fo from a viewpoint that the output signal Vfo is changed in stages as many as possible.

Third Embodiment

Figure 16:
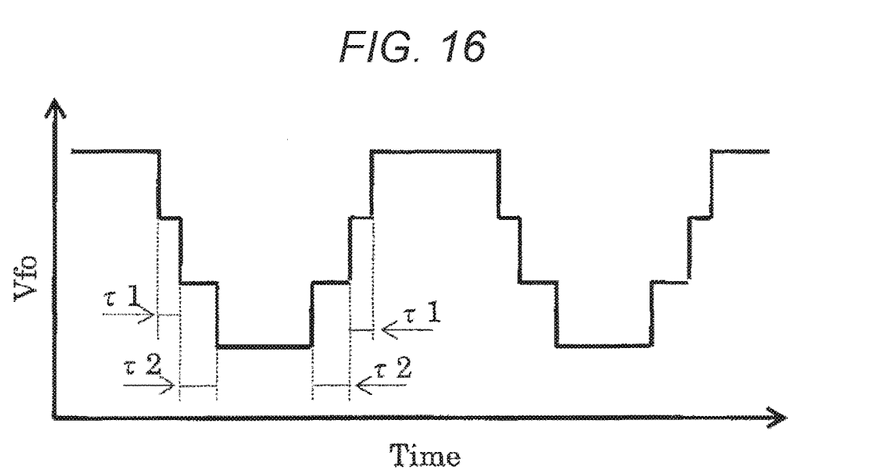
FIG. 16 is a diagram illustrating a waveform of the output signal of the open drain circuit 1 according to a third embodiment.

FIG. 16 is a diagram illustrating a waveform of the output signal of the open drain circuit 1 according to a third embodiment of the invention. In FIG. 16, a plurality of time differences τ are provided in the switching timing between the respective open drain transistors. The time difference between Tr1 and Tr2 is τ1, and the time difference between Tr2 and Tr3 is τ2. Since T1 and τ2 are determined according to Equations 9 to 11, τ1 and τ2 can be adjusted as illustrated in FIG. 16 by adjusting a voltage division ratio of the voltage-dividing resistors Rg1 to Rg4.

In FIG. 16, when the output voltage Vfo is switched from a high potential (high level) to a low potential (low level), a delay time interval (τ1) of the switching element to be switched early is smaller than a delay time interval (τ2) of the switching element to be switched later. On the other hand, When the output voltage Vfo is switched from the low potential to the high potential, the delay time interval (τ2) of the switching element to be switched early is larger than the delay time interval (τ1) of the switching element to be switched later. In other words, τ1 and τ2 both are constant.

Figure 17:
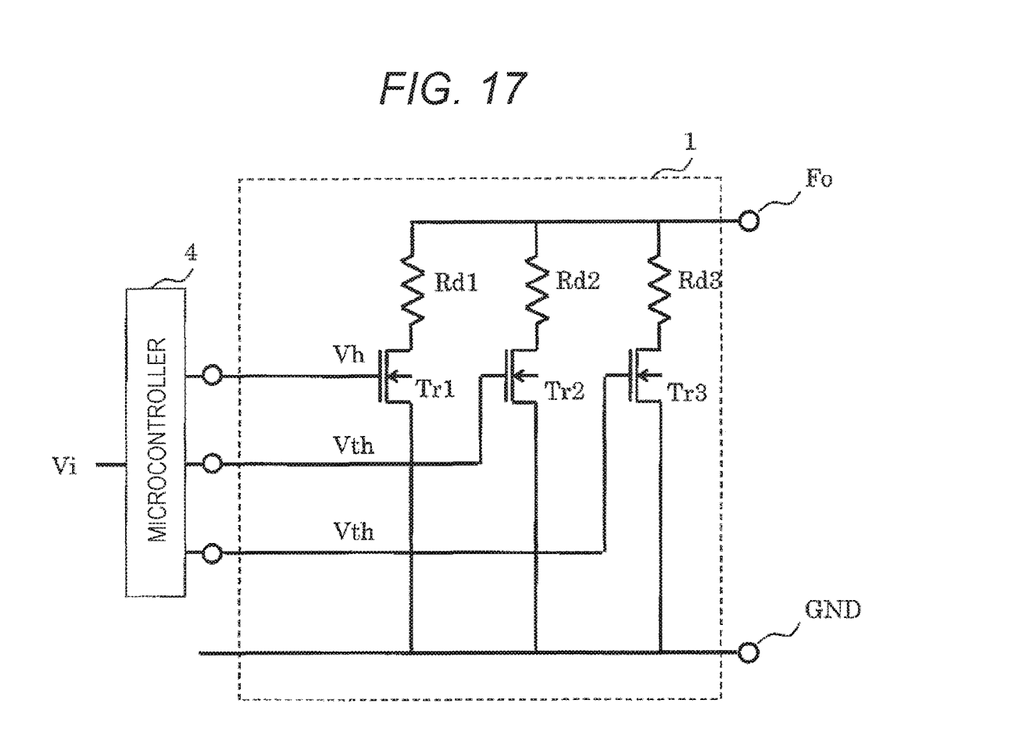
FIG. 17 is a diagram illustrating a modification of the open drain circuit 1 according to the third embodiment.

FIG. 17 is a diagram illustrating a modification of the open drain circuit 1 according to the third embodiment. There are provided a plurality of time differences of the switching timing between the respective switching elements as τ1 and τ2 of FIG. 16. Therefore, the time differences may be provided in timing when the threshold voltage Vth is output to the respective gate terminals. The open drain circuit 1 illustrated in FIG. 17 is provided with a microcontroller 4 which realizes such a configuration. The microcontroller 4 receives the input signal Vi, calculates a desired timing of switching the respective transistors according to Vi, and outputs Vth to the gate terminals of the respective transistors at that timing.

Figure 18:
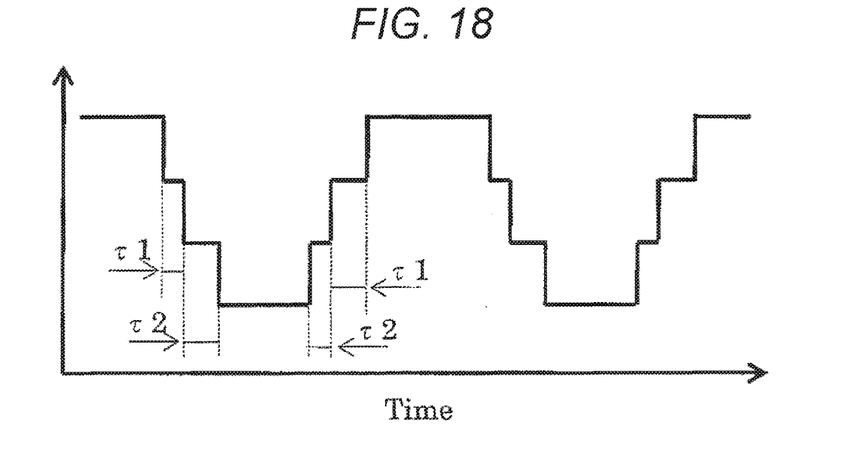
FIG. 18 is a diagram illustrating an exemplary waveform of the output signal in the circuit configuration of FIG. 17.

FIG. 18 is an exemplary waveform of the output signal in the circuit configuration of FIG. 17, In FIG. 18, when the output voltage Vfo is switched from the high potential to the low potential, the delay time interval (τ1) of the switching element to be switched early is smaller than the delay time interval (τ2) of the switching element to be switched later. On the other hand, in a case where the output voltage Vfo is switched from the low potential to the high potential, the delay time interval (τ2) of the switching element to be switched early is smaller than the delay time interval (τ1) of the switching element to be switched later. In other words, τ1 and τ2 change according to time.

In an actual product using the open drain circuit 1, a capacitor, a resistor, and a diode may be provided as a surge protection element and a protection element against static discharge. In order to making an optimal setting to reduce radiation noises in a state where these elements are provided, there may be needed a plurality of switching time differences as illustrated in FIGS. 16 and 18. The output waveform according to the third embodiment is suitable to such as case.

Fourth Embodiment

Figure 19:
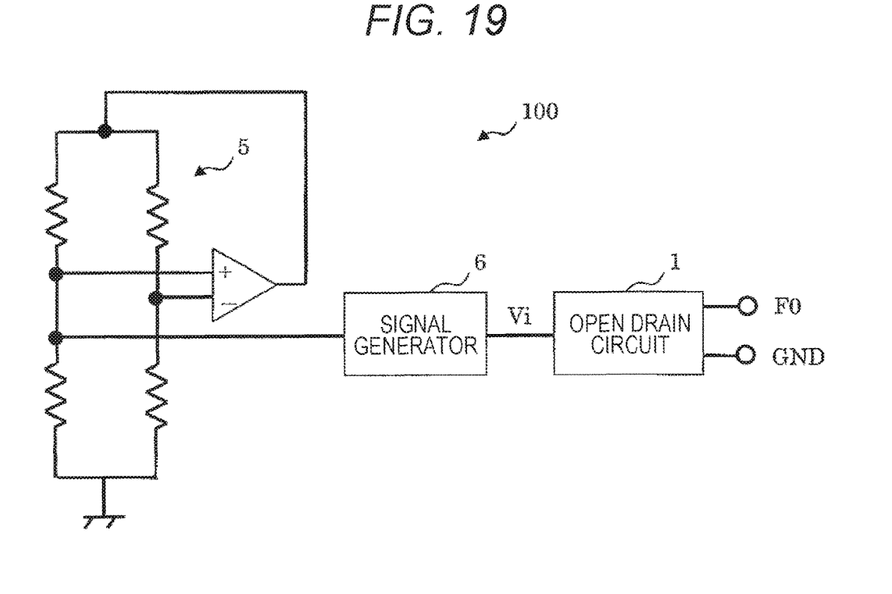
FIG. 19 is a diagram illustrating a configuration of a thermal-type flow meter 100 according to a fourth embodiment.

FIG. 19 is a diagram illustrating a configuration of a thermal-type flow meter 100 according to a fourth embodiment of the invention. The thermal-type flow meter 100 is a sensor to measure a flow rate of air, and provided with a measuring element 5, a signal generator 6, and the open drain circuit 1 according to the first to third embodiments. The measuring element 5 measures a flow rate of air, and outputs a meter voltage Vm corresponding to the measurement result. The signal generator 6 generates a periodic signal expressing the measurement result indicated by the meter voltage Vm using a frequency, and outputs the periodic signal to the open drain circuit 1 as the input signal Vi. The thermal-type flow meter 100 shows the flow rate of air using the frequency of the periodic signal. Therefore, it is desirable that the open drain circuit 1 according to the first to third embodiments be used.

The invention is not limited to the above embodiments, and includes various modifications. The above embodiments are merely given to describe the invention in detail to help easy understanding, and there is no need to provide all the configurations described above. For example, the following modifications can be considered.

The above embodiments have been described on an assumption that a field effect transistor (FET) is used as the open drain transistor, but the same configuration of the invention can be employed even in a case where a bipolar transistor is used. In other words, the same configuration of the invention can be employed in a circuit configuration in which the output signal is switched in a stepwise shape between the high level and the low level at every time when the respective switching elements connected at multiple stages are switched.

In the above embodiment, the triangular wave has been used as the input signal Vi, and the same configuration of the invention can be employed even in a case where other periodic signal such as a sinusoidal wave or a trapezoid wave is used.

In the above embodiment, the description has been made about that the period of the input signal Vi is in proportion to the delay time 17, but not limited to a linear proportion relation. Other correspondence relations may be employed as long as t is increased or decreased according to increase/decrease of Vi.

REFERENCE SIGNS LIST 1 open drain circuit
2 frequency measurement circuit
3 frequency meter
4 microcontroller
5 measuring element
6 signal generator
Tr1 to Tr3 open drain transistor
Rg1 to Rg4 voltage-dividing resistor
Rd1 to Rd3 current limit resistor

The invention claimed is:

1. A thermal-type flow meter at outputs an output signal indicating a flow rate of air using a frequency, comprising:
   a signal generator that generates a periodic signal indicating the flow rate using a frequency;
   a shunt circuit that is configured by a plurality of switching elements connected in parallel, and outputs the output signal corresponding to the periodic signal; and
   a delay circuit that delays an operation timing of each switching element such that the respective switching elements are turned on at different phases of the periodic signal,
   wherein the shunt circuit is configured to lower a signal level of the output signal from a high level in a stepwise shape whenever each switching element is turned on, and to make the signal level of the output signal fall to a low level when all the switching elements are turned on, and wherein the delay circuit changes the delayed time duration to be shortened as the frequency of the periodic signal is increased, and changes the delayed time duration to be lengthened as the frequency of the periodic signal is decreased.

2. The thermal-type flow meter according to claim 1, wherein the delay circuit changes the delayed time duration in proportion to the frequency of the periodic signal.

3. The thermal-type flow meter according to claim 1, wherein at least one of the switching elements includes a current limit resistor that is connected to an output terminal of the output signal.

4. The thermal-type flow meter according to claim 3, wherein the switching element disposed at a final stage of the shunt circuit does not include the current limit resistor, and the other switching elements of the shunt circuit include the current limit resistor.

5. The thermal-type flow meter according to claim 3, wherein the switching element disposed at a final stage of the shunt circuit does not include the current limit resistor, and the other switching elements of the shunt circuit include the current limit resistor, wherein the delay circuit adjusts an operation timing of each switching element such that an order of switching the switching elements of the shunt circuit from an ON state to an OFF state is reversed to an order of switching from the OFF state to the ON state, and wherein the delay circuit turns finally on the switching element having no current limit resistor when the output signal is switched from the high level to the low level, and turns firstly off the switching element having no current limit resistor when the output signal is switched from the low level to the high level.

6. The thermal-type flow meter according to claim 1, wherein the delay circuit adjusts an operation timing of each switching element such that an order of switching the switching elements of the shunt circuit from an ON state to an OFF state is reversed to an order of switching from the OFF state to the ON state.

7. The thermal-type flow meter according to claim 1, wherein the delay circuit is configured by a voltage-dividing circuit that divides a voltage applied to a gate terminal of each switching element to be different values for each switching element.

8. The thermal-type flow meter according to claim 1, wherein the delay circuit is configured by a calculation circuit that calculates the delayed time duration according to a period of the periodic signal and drives the switching element according to the time duration.

9. The thermal-type flow meter according to claim 1, wherein the delay circuit adjusts the delayed time duration such that the delayed time duration between any switching elements becomes different from the delayed time duration between other switching elements.

10. The thermal-type flow meter according to claim 1, wherein the signal generator generates a triangular wave signal as the periodic signal.

* * * * *